(12) United States Patent
Ferru et al.

(10) Patent No.: US 7,772,100 B2
(45) Date of Patent: Aug. 10, 2010

(54) METHOD OF MANUFACTURING A SEMICONDUCTOR DEVICE HAVING A BURIED DOPED REGION

(75) Inventors: Gilles Ferru, Cairon (FR); Serge Bardy, Caen (FR)

(73) Assignee: NXP B.V., Eindhoven (NL)

( * ) Notice: Subject to any disclaimer, the term of this patent is extended or adjusted under 35 U.S.C. 154(b) by 242 days.

(21) Appl. No.: 11/909,446

(22) PCT Filed: Mar. 21, 2006

(86) PCT No.: PCT/IB2006/050862

§ 371 (c)(1),
(2), (4) Date: Apr. 11, 2008

(87) PCT Pub. No.: WO2006/100640

PCT Pub. Date: Sep. 28, 2006

(65) Prior Publication Data

US 2008/0277764 A1     Nov. 13, 2008

(30) Foreign Application Priority Data

Mar. 24, 2005    (EP)   .................................. 05300223

(51) Int. Cl.
*H01L 21/74*     (2006.01)
*H01L 29/868*     (2006.01)

(52) U.S. Cl. ...................................... 438/542; 438/543

(58) Field of Classification Search ......... 438/542–549, 438/558, 561–564, 207, 246, 389
See application file for complete search history.

(56) References Cited

U.S. PATENT DOCUMENTS 6,316,336 B1    11/2001    Blanchard

FOREIGN PATENT DOCUMENTS

| DE | 3629685 A1 | | 3/1988 |
| EP | 0550870 A1 | | 7/1993 |
| GB | 0550870 | * | 12/1992 |

* cited by examiner

*Primary Examiner*—Kiesha R Bryant
*Assistant Examiner*—Ali Naraghi

(57) ABSTRACT

A method of providing a region of doped semiconductor (40) which is buried below the surface of a semiconductor substrate (10) without the requirement of epitaxially deposited layers is provided. The method includes the steps of forming first and second trench portions (26,28) in a semiconductor substrate and then introducing dopant (100) into the trench portions and diffusing the dopant into the semiconductor substrate such that a region of doped semiconductor (40) is formed extending from the first trench portion to the second trench portion. A diffusion barrier, for example formed of two barrier trenches (16, 18), is provided in the substrate adjacent the doping trenches to inhibit lateral diffusion of dopant from the doping trenches so as to maintain an undoped region (30) above the region of doped semiconductor. Advantageously, the electrical properties of the buried layer can be adjusted by varying the depths and size/spacing of the doping trenches and diffusion barrier(s), and the doping and diffusion parameters. The doping trenches can later be filled with polysilicon to provide electrical contact to the buried doped region.

13 Claims, 6 Drawing Sheets

METHOD OF MANUFACTURING A SEMICONDUCTOR DEVICE HAVING A BURIED DOPED REGION

The invention relates to the formation of doped regions buried beneath the surface of a semiconductor substrate in a semiconductor device.

Semiconductor devices such as integrated circuits often comprise regions of doped semiconductor buried beneath the surface of a substrate, or wafer. These serve, for example, to provide regions of semiconductor having increased conductivity. Doped regions are formed by introducing dopant, typically n-type or p-type, into the semiconductor by implanting and diffusing for example.

There are several known methods to create the doped regions beneath the surface of the wafer. In a first known method the surface of a semiconductor wafer is implanted with dopant. The dopant is then diffused into the wafer by heating thereof. A layer of semiconductor is then grown on the surface of the wafer by epitaxial deposition thereby 'burying' the doped region. The depth at which the doped region is buried is dependent upon the epitaxial thickness. This method is widely used throughout semiconductor processing, particularly for bipolar processing. However, the epitaxial growth of the semiconductor layer is known to cause crystalline defects in the final product. Also, more importantly from an industrial point of view, the epitaxy processing is relatively expensive.

In a second known method, dopant is introduced into the semiconductor wafer with a very high energy implantation step. This ensures that the dopant is buried beneath the surface of the wafer, thereby avoiding the need to grow a further semiconductor layer thereover. However, the depth at which the dopant ions are buried and the concentration thereof is somewhat limited when using this method. Moreover, the process of high-energy implantation is known to distort the upper regions of the crystalline lattice.

U.S. Pat. No. 6,316,336 discloses a method of forming a buried layer without epitaxy. Trenches are formed in the semiconductor wafer. The vertical sides thereof are then coated with a dielectric layer. Dopant is introduced at the bottom of the trenches by ion implantation. After filling the trenches with an unspecified material, the wafer undergoes a heat treatment which causes the dopant to diffuse into the wafer thereby creating a single doped region beneath the surface of the wafer.

The method disclosed by U.S. Pat. No. 6,316,336 requires the dopant to be introduced at the bottom of the trenches whilst avoiding the sides. Otherwise, parts of the wafer adjacent the trenches could unintentionally become doped with the impurities.

According to the present invention there is provided a method of providing a region of doped semiconductor below the surface of a semiconductor substrate, the method comprising the steps of:
forming first and second trench portions in a semiconductor substrate;
introducing dopant into the trench portions and diffusing the dopant into the semiconductor substrate such that a region of doped semiconductor is formed extending from the first trench portion to the second trench portion;
wherein the method further comprises the steps of:
forming a diffusion barrier in the semiconductor substrate before diffusing the dopant, the diffusion barrier serving to inhibit diffusion of dopant from the first and/or second trench portions so as to maintain an undoped region above the region of doped semiconductor.

By providing a diffusion barrier prior to the diffusing of the dopant it is possible to create a buried doped region in a wafer which surrounds an undoped 'well'. If the wafer is initially doped with one conductivity type, n-type or p-type, then the well provided by the method according to the invention can be of the opposite conductivity type to the buried region.

Lateral diffusion is inhibited by the diffusion barrier which serves to shield the volume for the desired undoped well from diffused dopant ions. Advantageously, the technique requires no epitaxial deposition nor high-energy implant for the formation of the buried doped region. Furthermore, the dopant can be introduced into the trenches without the need to insulate the sides thereof because the diffusion barrier limits the lateral diffusion. The method employs processing steps which can be incorporated into a fabrication line simply and, therefore, cheaply.

The first and second trench portions are preferably formed so that they are deeper than the diffusion barrier. This allows lateral diffusion of the dopant from each of the trenches portions to overlap so as to form a single buried doped region below an undoped well, the depth of which is defined by the diffusion barrier.

The diffusion barrier may be provided by forming third and fourth trench portions spaced from one another between the first and second trench portions. In this way, these barrier trench portions can be employed to define the dimensions of the undoped well by adjusting the depths and widths thereof for example. The diffusion barrier may comprise more than two trench portions to better define the desired shielded volume. The barrier trench portions may be provided by a single barrier trench which is arranged in a closed-loop which may be for example substantially annular or rectangular in shape. Moreover, the first and second (doping) trenches may be provided by a single doping trench which is arranged in a closed-loop which may also be substantially annular or rectangular in shape. Different numbers and arrangements of doping and/or barrier trenches can be adopted so as to suit the desired doping pattern. For example, a plurality of doping and barrier trenches formed in concentric rings can be employed to form annular undoped well regions in the wafer.

The trenches employed for the diffusion barrier are preferably deeper than 5 µm, or more preferably deeper than 10 µm. This depth determines the depth of any undoped regions shielded from the dopant diffusion. The trench portions may be filled with undoped polysilicon or a dielectric material such as TEOS or silicon dioxide so as to planarize the surface of the wafer and to enable subsequent photolithography steps.

After the dopant ions have been diffused into the semiconductor substrate to form the buried region, the first and second trench portions may be filled with conductive, semiconductive or insulating material. Example insulating material include silicon oxide and silicon nitride. An example semiconductive material is polysilicon. Example conductive materials include metals such as aluminium and doped polysilicon. In the case of a conductive filling, the trenches may be exploited in the final device to provide contacts to the buried doped region. In the case of a insulating filling, contact to the buried doped region can still be realised however, by providing a conductor next to the filled trench.

The invention may be applied in the manufacture of any semiconductor device comprising a region of doped semiconductor which is buried below the surface of a semiconductor substrate such as integrated circuit chips made by CMOS processing for example.

Embodiments of the invention will now be described, by way of example only, with reference to the following drawings in which:

FIGS. 1 to 6 show a sectional view of a semiconductor substrate at various stages of a method according to the invention;

FIGS. 7A-G show highly schematic plan views of part of a semiconductor substrate illustrating alternative embodiments of the invention; and, FIG. 8 shows an SEM sectional image of a semiconductor substrate comprising a buried layer and fabricated by a method in accordance with the invention.

It will be appreciated that the Figures are merely schematic. The same reference numerals are used throughout the Figures to denote the same or similar parts.

The invention provides a simple route for forming a doped region buried beneath the surface of a semiconductor substrate, or wafer. As discussed in the introduction, such regions are required for active devices such as transistors, disposed on a silicon wafer in CMOS integrated circuits for example. Generally, a p-n junction is desired which is formed at the interface between a region of p-type doped semiconductor and a region of n-type doped semiconductor. The invention enables a semiconductor substrate to be doped in a way which leaves a well of undoped material at the surface that is surrounded by a buried doped region.

With reference to FIG. 1 part of a semiconductor wafer 10 is provided and is doped n-type for example. Before fabricating a buried layer in accordance with the invention the semiconductor wafer 10 may undergo any number of standard processing steps such as doping, diffusion, etching and thin film deposition for example. Such steps may be required to provide other active and/or passive devices on the same semiconductor wafer. For the purposes of describing the invention, the shown part of the wafer 10 is formed of n-type doped silicon. However, it will be appreciated by the skilled person that other semiconducting materials may be used instead and may be doped p-type. Also a semi-insulating material may be employed such as highly resistive silicon.

A non-oxidisable dielectric 12 is deposited on the substrate so as to form a protective layer during subsequent dry etching steps. This deposition may be carried out using a known deposition technique.

As shown in FIG. 2, barrier trenches 16, 18 are etched to a depth of about 10 μm. The barrier trenches 16 and 18 are provided by a dry etch. FIG. 7A is a schematic plan view of part of the wafer 10 and shows the arrangement of the barrier trenches 16, 18 as substantially straight and parallel with one another, each having an equal, finite length.

Referring again to FIG. 2, once the barrier trenches 16, 18 are formed, the silicon substrate 10 is oxidised so as to passivate the surface, i.e. to reduce the number of dangling bonds. This step is optional, the requirement depending on the desired quality of the final device. An insulating material such as TEOS is then deposited so as to fill the barrier trenches. The barrier trenches 16, 18 serve to provide a barrier against diffusion of dopant ions at a later stage in fabrication of the device.

With reference to FIG. 3 a dry etch is performed in order to remove the TEOS from outside the trenches. Windows are patterned in the dielectric layer 12 in regions outside the filled trenches 16, 18. Inside these windows a dry etch is carried out to define doping trenches 26, 28 spaced laterally either side of the barrier trenches 16 and 18. The doping trenches 26, 28 are formed having a deepness which is greater than that of the filled barrier trenches 16, 18, for example 15 μm. Sectional and plan views of the arrangement of the trenches are shown in FIGS. 4 and 7A respectively. It will be appreciated that the formation of windows is not essential to the invention.

Dopant ions are introduced into the doping trenches 26, 28 as shown in FIG. 5 and referenced as 100. The ions are p-type and are introduced by means of a gaseous, liquid or solid source. Example dopant sources include boron nitride (solid), boron tribromide (liquid) and diborane (gaseous). The substrate is then heated to a temperature of around 1000° C. which causes the dopant ions in the doping trenches to diffuse into the wafer 10. The diffusion occurs in both a lateral direction and a vertical direction as shown by the arrows in FIG. 5. The filled barrier trenches serve to inhibit the diffusion of the ions in a lateral direction so as to maintain an undoped well 30. At depths lower than the barrier trenches, the lateral diffusion of the dopant ions overlaps so as to form a single buried doped region 40. Vertical diffusion up between the barrier trenches is limited due to the distance from the dopant source.

Once the diffusion is carried out the doping trenches 26, 28 are then filled with doped polysilicon for example as shown in FIG. 6. The doped polysilicon 50 can be used to provide a contact to the buried doped region 40 and may be patterned accordingly using known techniques.

The above described method provides a simple route to forming a buried layer at sufficient depths beneath the surface of a semiconductor wafer. The specific embodiment described comprises two spaced, parallel, elongate doping trenches disposed in the wafer, and two spaced, parallel, elongate barrier trenches of similar length disposed therebetween. A plan view of this arrangement is shown in FIG. 7A. It is envisaged however that many alternative arrangements of the doping and barrier trenches are possible, examples of which are illustrated in FIGS. 7B to 7G. The barrier trenches are represented by the hatched regions, and the doping trenches by the dotted regions. It should be appreciated that these figures are highly schematic and serve merely to illustrate, in plan view, possible arrangements of the doping and barrier trenches, particularly in relation to one another.

Figure 1:
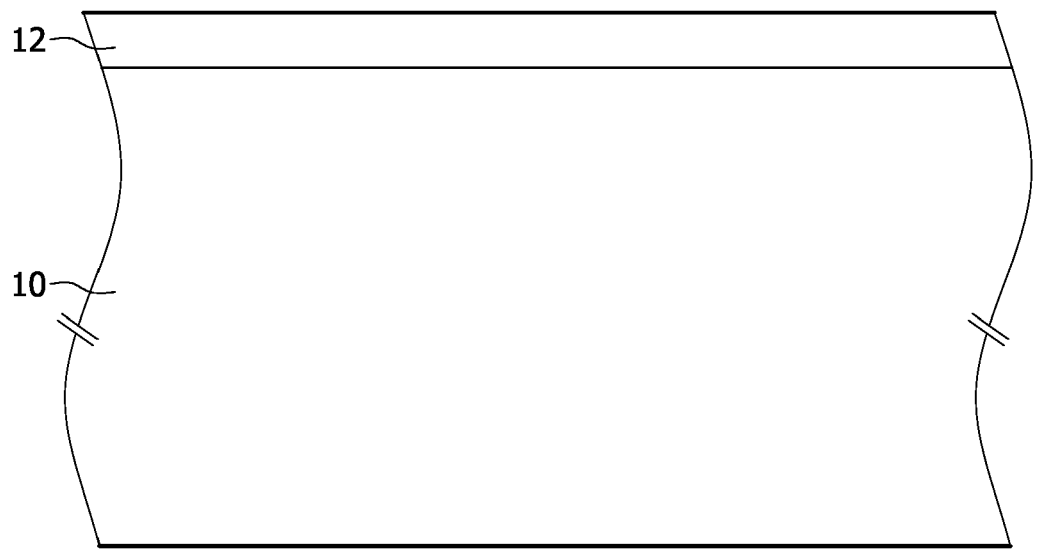
Figure 2:
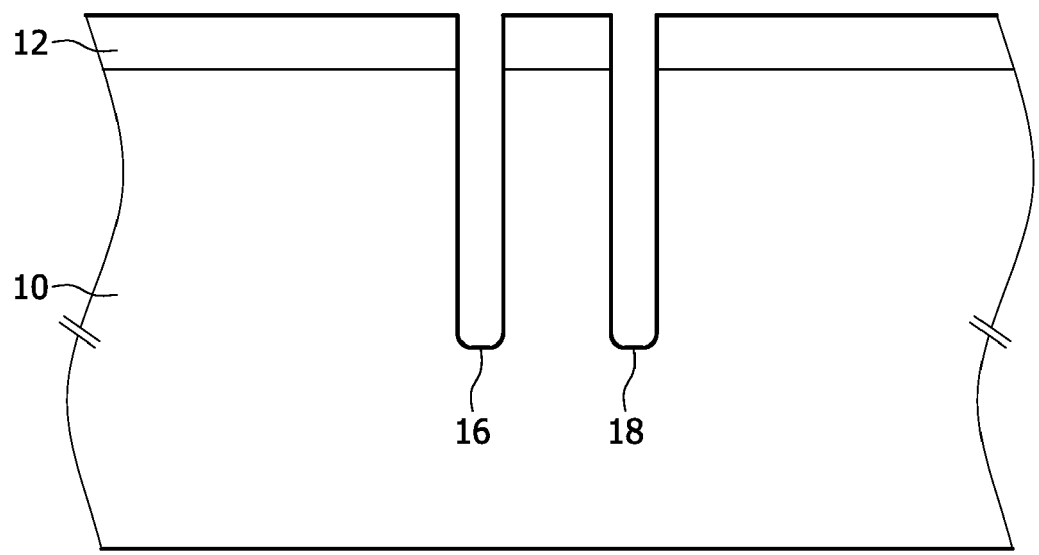
Figure 3:
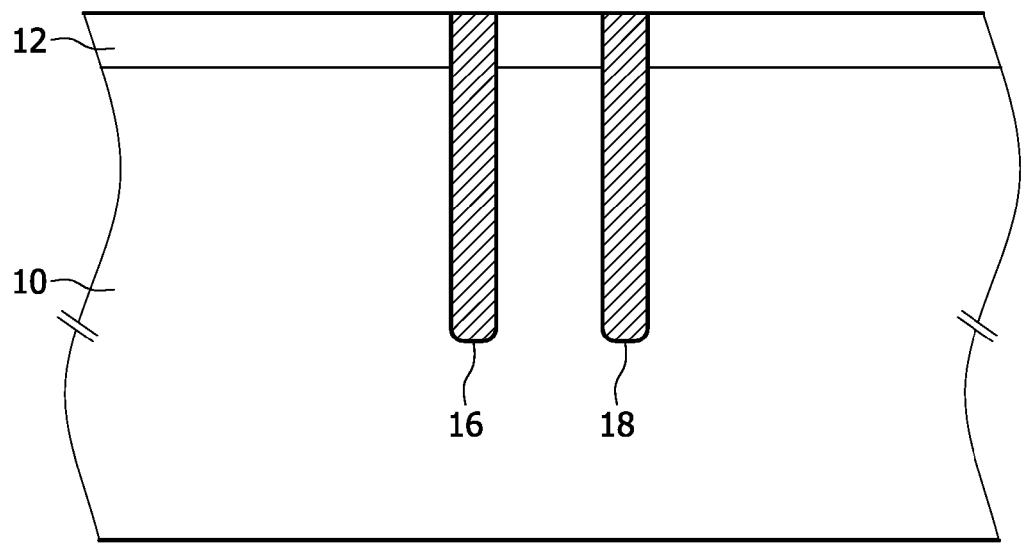
Figure 4:
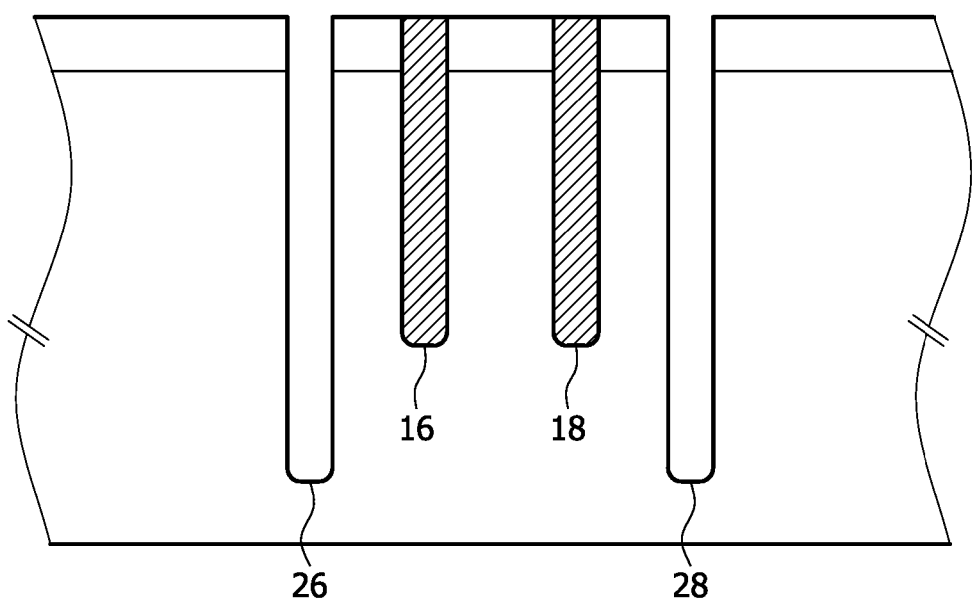
Figure 5:
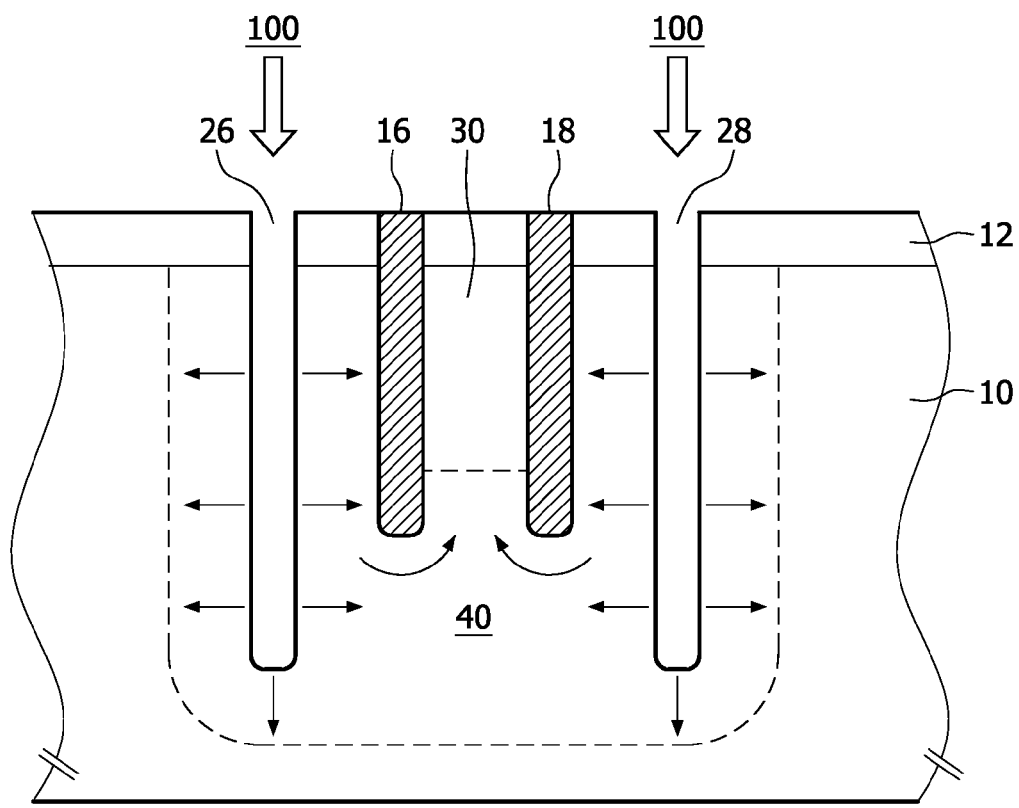
Figure 6:
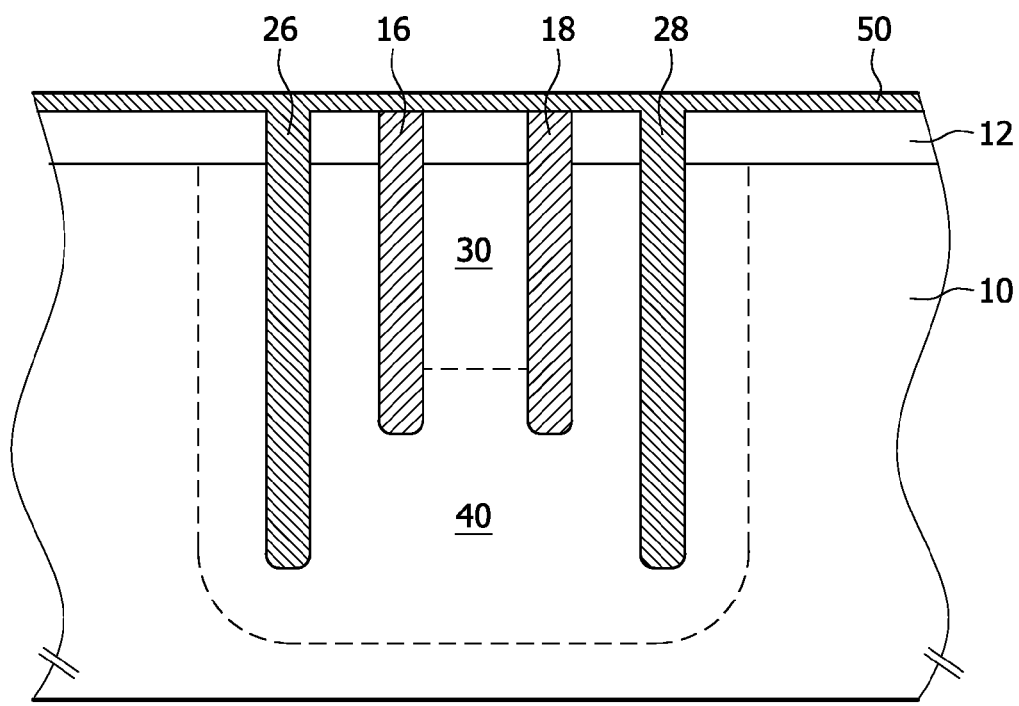
Figure 7A:
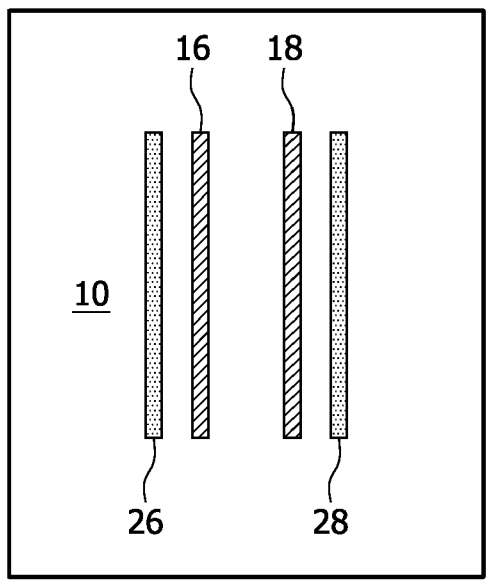
FIG. 7B shows an example arrangement in which the diffusion barrier consists of just one elongate barrier trench disposed between two elongate doping trenches. This arrangement can be exploited when isolation walls are required between blocks in an IC chip.
FIG. 7C shows three spaced, parallel, elongate doping trenches. Between adjacent doping trenches, two spaced, parallel, elongate barrier trenches are disposed so as to define the position of two undoped well regions.
Figure 7B:
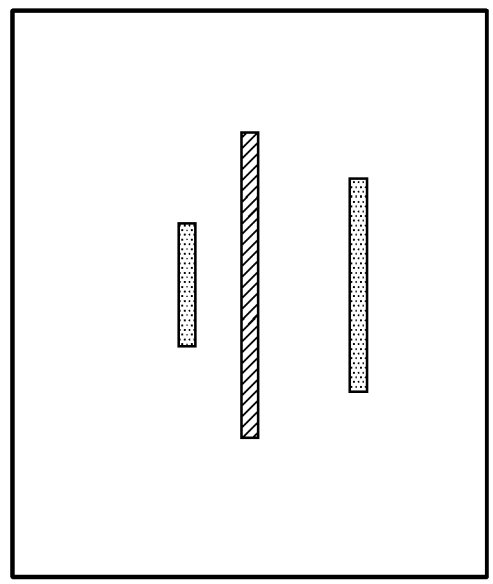
Figure 7C:
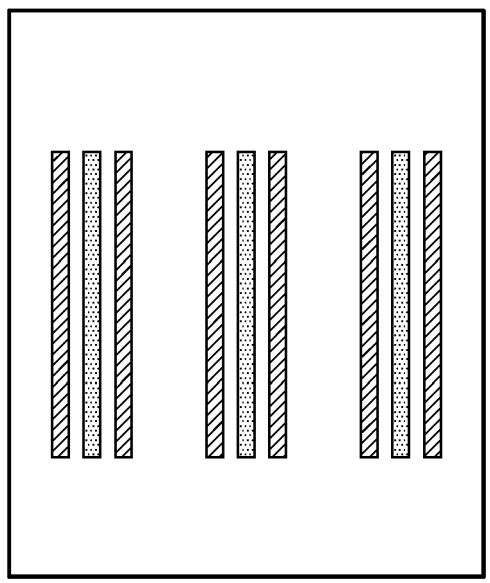
Figure 7D:
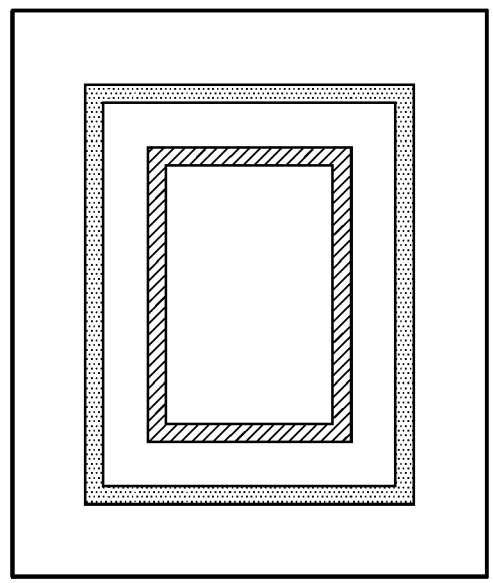
Figure 7E:
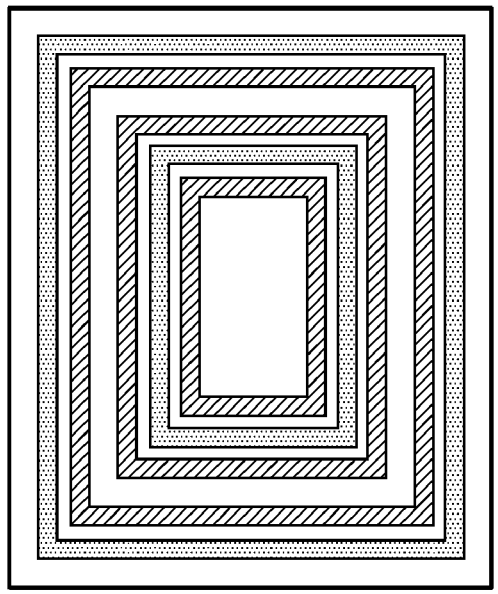

The example arrangement shown in FIG. 7D comprises a diffusion barrier which is formed of a single barrier trench which is arranged in a closed-loop. More precisely, the barrier trench is rectangular. The first and second doping trench portions in this example are provided by a single rectangular doping trench disposed so as to surround the barrier trench. This embodiment of the invention results in a substantially cuboid-shaped undoped well region. Furthermore, this arrangement can be extended to employ a plurality of rectangular doping trenches. For example, FIG. 7E shows one rectangular doping trench disposed within a second one of larger dimensions. A series of corresponding rectangular barrier trenches serve to define two undoped well regions within the wafer: one having a substantially cuboid-shaped volume and one having a substantially rectangular loop shape surrounding the cuboid well.

Figure 7F:
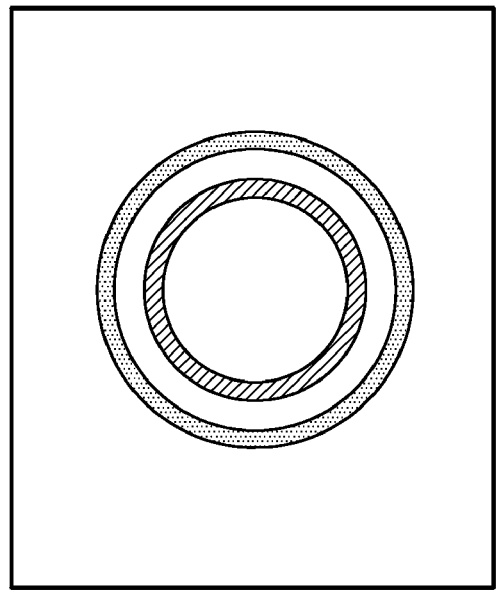
Figure 7G:
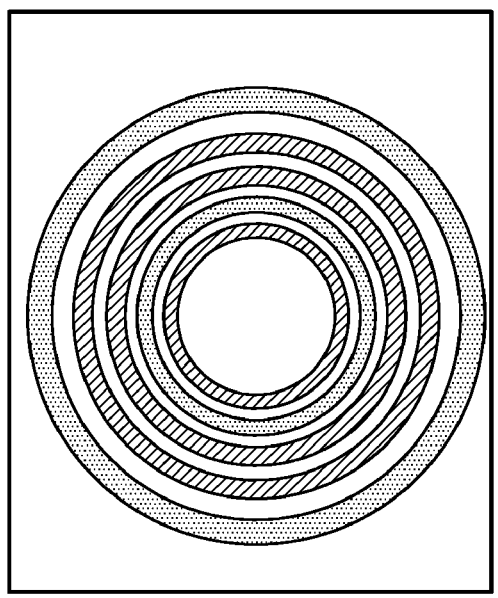

The same principles can be applied to annular trenches as shown in FIGS. 7F and 7G.

Figure 8:
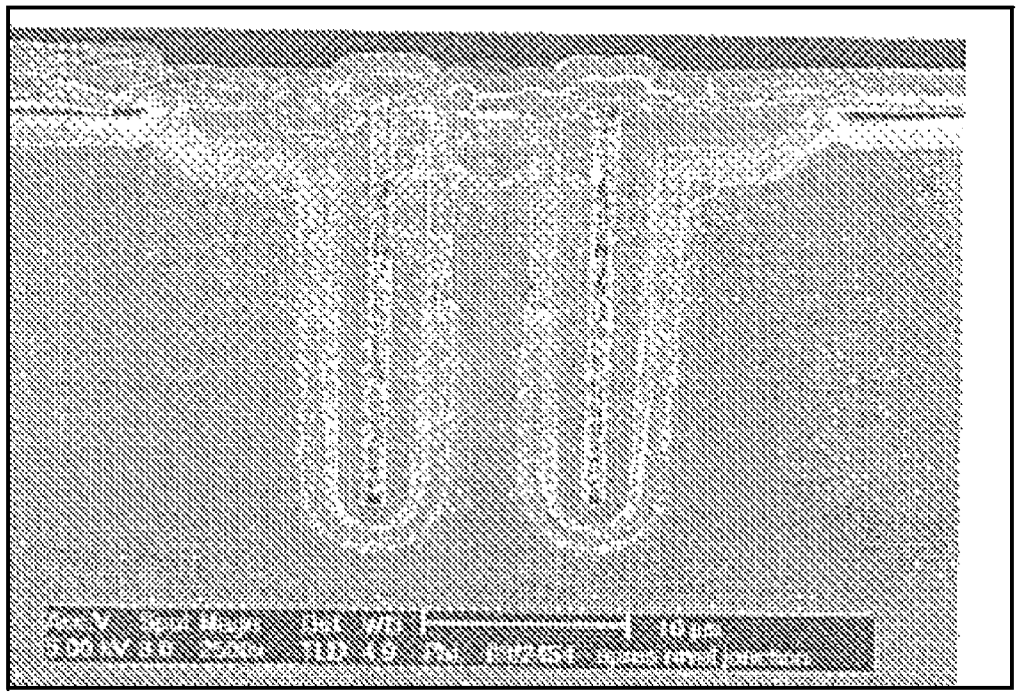

It will be appreciated by a skilled person that the electrical properties of the buried layer can be adjusted by varying the depths and size/spacing of the separate trenches and the doping and diffusion parameters. An example application of the invention is the making of full encapsulation RF pin diodes in a low cost passive device integration technology. From the DC pin diode characteristics obtained by experimentation it has been concluded that the parasitic anode/cathode/substrate PNP transistor is deactivated in the low current regime. This provides an indication that the buried layer is indeed present and effective. FIG. 8 shows an SEM sectional view through a device made during experimentation.

In summary there is provided a method of forming a region of doped semiconductor which is buried below the surface of a semiconductor substrate without the requirement of epitaxially deposited layers. The method includes the steps of forming first and second (doping) trench portions in a semiconductor substrate and then introducing dopant into the trench portions and diffusing the dopant into the semiconductor substrate such that a region of doped semiconductor is formed extending from the first trench portion to the second trench portion. A diffusion barrier, for example formed of two barrier trenches, is provided in the substrate adjacent, but separate from, the trenches to inhibit lateral diffusion of dopant from the doping trenches so as to maintain an undoped region above the region of doped semiconductor. Advantageously, the electrical properties of the buried layer can be adjusted by varying the depths and size/spacing of the doping trenches and diffusion barrier(s), and the doping and diffusion parameters. The doping trenches can later be filled with polysilicon to provide electrical contact to the buried doped region.

From reading the present disclosure, other variations and modifications will be apparent to persons skilled in the art. Such variations and modifications may involve equivalent and other features which are already known in the design, manufacture and use of semiconductors and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A method of providing a region of doped semiconductor below the surface of a semiconductor substrate, the method comprising:
    forming first and second trench portions in a semiconductor substrate;
    introducing dopant into the trench portions;
    forming a diffusion barrier in the semiconductor substrate, the first and second trench portions being deeper than the diffusion barrier;
    then diffusing the dopant into the semiconductor substrate such that a region of doped semiconductor is formed extending from the first trench portion to the second trench portion, the diffusion barrier serving to inhibit diffusion of dopant from the first or second trench portions so as to maintain an undoped region above the region of doped semiconductor and;
    wherein forming the diffusion barrier includes forming third and fourth trench portions spaced from one another between the first and second trench portions.

2. A method according to claim 1, further comprising the step of filling the third and fourth trench portions with a dielectric material.

3. A method according to claim 1, wherein the depths of the third and fourth trench portions are greater than 5 μm.

4. A method according to claim 3, wherein the depths of the third and fourth trench portions are greater than 10 μm.

5. A method according to claim 1, wherein the third and fourth trench portions are provided by a single barrier trench which is arranged in a closed-loop.

6. A method according to claim 5, wherein the single barrier trench is annular.

7. A method according to claim 5, wherein the single barrier trench is substantially rectangular.

8. A method according claim 7, wherein the first and second trench portions are provided by a single doping trench which is arranged in a closed-loop.

9. A method according to claim 8, wherein the single doping trench is annular.

10. A method according to claim 8, wherein the single doping trench is substantially rectangular.

11. A method according to claim 10, including the step of filling the first and second trench portions with polysilicon after introducing the dopant therein.

12. A method according to claim 11, wherein the semiconductor substrate comprises n-type or p-type doped silicon and wherein the dopant introduced into the trench portions is of the opposite conductivity type to that of the substrate.

13. An integrated circuit device comprising a region of doped semiconductor which is buried below the surface of a semiconductor substrate and fabricated according to claim 12.

* * * * *